(12) United States Patent
Villwock et al.

(10) Patent No.: US 8,604,745 B2
(45) Date of Patent: Dec. 10, 2013

(54) APPARATUS AND METHOD FOR ROTATING-SENSORLESS IDENTIFICATION OF MECHANICAL PARAMETERS OF A THREE-PHASE ASYNCHRONOUS MOTOR

(75) Inventors: Sebastian Villwock, Pechbrunn (DE); Heiko Zatocil, Nuremberg (DE)

(73) Assignee: Baumuller Nurnberg GmbH, Nuremberg (DE)

( * ) Notice: Subject to any disclaimer, the term of this patent is extended or adjusted under 35 U.S.C. 154(b) by 219 days.

(21) Appl. No.: 13/205,859

(22) Filed: Aug. 9, 2011

(65) Prior Publication Data

US 2012/0038311 A1 Feb. 16, 2012

(30) Foreign Application Priority Data

Aug. 16, 2010 (EP) .................................... 10172911

(51) Int. Cl.
*H02P 21/00* (2006.01)
(52) U.S. Cl.
USPC ........... 318/806; 318/801; 318/727; 318/599; 318/400.32; 318/609; 318/148
(58) Field of Classification Search
USPC ............ 318/806, 811, 599, 727, 778, 400.02, 318/575, 400.14, 400.15, 801, 400.32, 148; 363/24, 41, 27, 28
See application file for complete search history.

(56) References Cited

U.S. PATENT DOCUMENTS

| | | | | |
|---|---|---|---|---|
| 5,264,773 A | * | 11/1993 | Koyama et al. | 318/798 |
| 5,475,293 A | * | 12/1995 | Sakai et al. | 318/802 |
| 5,619,435 A | * | 4/1997 | Prakash et al. | 703/3 |
| 5,629,597 A | * | 5/1997 | Imanaka | 318/805 |
| 5,729,113 A | * | 3/1998 | Jansen et al. | 318/799 |
| 5,886,498 A | * | 3/1999 | Sul et al. | 318/821 |
| 5,994,867 A | * | 11/1999 | Birk et al. | 318/609 |
| 6,014,006 A | * | 1/2000 | Stuntz et al. | 318/804 |

(Continued)

FOREIGN PATENT DOCUMENTS

KR  2008 0062830 A  7/2008

OTHER PUBLICATIONS

Villwock, Sebastian; Pacas, Mario; Eutebach, Thomas, Application of the Welch-Method for the Automatic Parameter Identification of Electrical Drives, Industrial Electronics Society, 2005, 31st Annual Conference of IEEE, Piscataway, NJ, Nov. 6, 2005, pp. 1449-1454.

(Continued)

*Primary Examiner* — Rita Leykin
(74) *Attorney, Agent, or Firm* — Frank H. Foster; Kremblas & Foster

(57) ABSTRACT

A method for the identification without shaft encoder of magnetomechanical characteristic quantities of a three-phase asynchronous comprising: —constant voltage impression $U_{1\alpha}$ in α axial direction in order to generate a constant magnetic flux; —test signal voltage supply $U_{1\beta}$ in β axial direction of the asynchronous motor, whereby the α axial direction remains supplied with constant current; —measuring signal current measurement $I_{1\beta}$ in β stator axial direction of the asynchronous motor; —identification of mechanical characteristic quantities of the asynchronous motor based on the test signal voltage $U_{1\beta}$ and on the measuring signal current $I_{1\beta}$, whereby the rotor can execute deflection movements. Method can also be used for control of electrical drives. An identification apparatus for the determination of mechanical characteristic quantities of an asynchronous motor and for motor control, whereby the identified characteristic quantities can be used to determine, optimize and monitor a motor control.

13 Claims, 6 Drawing Sheets

(56) References Cited

U.S. PATENT DOCUMENTS

| | | | |
|---|---|---|---|
| 6,433,506 B1 * | 8/2002 | Pavlov et al. | 318/804 |
| 6,639,380 B2 * | 10/2003 | Sul et al. | 318/727 |
| 6,822,416 B1 * | 11/2004 | Kunz et al. | 318/700 |
| 7,592,785 B2 * | 9/2009 | Kimura et al. | 322/59 |
| 7,855,526 B2 * | 12/2010 | Ohnishi et al. | 318/800 |
| 8,384,338 B2 * | 2/2013 | Lu et al. | 318/811 |
| 2012/0038300 A1 * | 2/2012 | Kato et al. | 318/400.22 |

OTHER PUBLICATIONS

Villwock, Sebastian; Pacas, Mario, Application of the Welch-Method for the Identification of Two- and Three-Mass-Systems, IEEE Transactions on Industrial Electronics, vol. 55, No. 1, Jan. 2008, pp. 457-466.

\* cited by examiner

APPARATUS AND METHOD FOR ROTATING-SENSORLESS IDENTIFICATION OF MECHANICAL PARAMETERS OF A THREE-PHASE ASYNCHRONOUS MOTOR

The present invention starts from a method, a device, an apparatus and the use of a method for an identification of magnetomechanical characteristic quantities, in particular the mass moment of inertia J of a three-phase asynchronous motor. Mechanical characteristic quantities make possible the characterization of a three-phase motor relative to the mechanical dynamic behavior, so that mechanical and rotational behaviors of the motor can be characterized during operation.

STATE OF THE ART

Various methods are known from the state of the art for determining the mechanical behavior of a three-phase motor. As a rule, sensor data from position transmitters, angle of rotation transmitters or engine speed sensors are evaluated for the determination of the mechanical behavior, and the mass moment of inertia J of the rotor: $J = \int r^2 \rho(\vec{r}) dV$ with $\rho(\vec{r})$ of the mass density in the volume V with distance r from the axis of the rotor is determined taking into account mechanical structural data of the three-phase motor. The mass moment of inertia J indicates the resistance of the rotor upon a change of its rotational state and thus describes the rotary dynamic of the motor. The torque M can be calculated from it by M—$M = \dot{\omega} J = \alpha J$. However, modern electrical drives regulated without a shaft encoder can not fall back on sensor data, so that mechanical characteristic quantities can not be determined in normal operation.

In a three-phase system in a Y or Δ circuit the current results by feeding two phases according to the rule $I_u + I_v + I_w = 0$ with lacking star point grounding. For this reason a three-phase system can also be described with two coordinates, whereby in order to describe the total current a coordinate system can be considered in the complex plane in which the two coordinates real part and imaginary part can be designated as α and β coordinates as regards the stationary alignment of the stator windings according to FIG. 1. The α/β coordinate system describes, for example, the direction of the current flux or the rotor flux axis in the resting reference system of the stator of the three-phase motor. As regards the magnetic alignment of the rotor, a second rotating coordinate system can be introduced whose axes are designated as the d axis and the q axis of the rotor, as is shown in FIG. 2. The d axis designates the direction of the magnetic flux of the rotor and the q axis designates the transverse flux axis at a right angle to it. A transformation of an α/β stator coordinate system into the rotating d/q rotor coordinate system can be brought about via the angle of rotation $\beta_k$ between the winding axis of the phase U of the stator and between the longitudinal axis of the rotor magnetic field. In this regard a total motor current I or its three-phase currents $I_U$, $I_V$ and $I_W$ can be considered in the stator-fixed α/β coordinate system or in the d/q coordinate system rotating with the rotor. As regards the conversion of the phase currents of the three-phase asynchronous motor into the α/β coordinate system, the following relationship applies:

i. $\begin{pmatrix} i_\alpha \\ i_\beta \end{pmatrix} = \begin{pmatrix} 1 & 0 & 0 \\ 0 & \frac{\sqrt{3}}{3} & -\frac{\sqrt{3}}{3} \end{pmatrix} \begin{pmatrix} i_u \\ i_v \\ i_w \end{pmatrix}, \begin{pmatrix} i_u \\ i_v \\ i_w \end{pmatrix} = \begin{pmatrix} 1 & 0 \\ -\frac{1}{2} & \frac{\sqrt{3}}{2} \\ -\frac{1}{2} & -\frac{\sqrt{3}}{2} \end{pmatrix} \begin{pmatrix} i_\alpha \\ i_\beta \end{pmatrix}.$ that can be modified by taking into account the rotor angle $\beta_k$ for the d/q coordinate system. For the following mathematical detection of the relationships a consideration is carried out in the α/β stator coordinate system according to FIG. 2, whereby the equivalent circuit shown in FIG. 4 describes an equivalent circuit characterization of the three-phase asynchronous machine in a single-phase system with feed voltages—and currents $U_1$, $I_1$ as well as $U_2$, $I_2$.

FIG. 4 shows the T-equivalent circuit of an asynchronous motor with reference to a single-phase consideration, whereby, given knowledge of the cited equivalent circuit magnitudes, the electrical operating behavior of the three-phase motor can be estimated in a stationary instance of operation, i.e., at a constant speed and load. The parameter s characterizes the slip, i.e., the lag of the rotation rotor opposite the rotating stator magnetic field. The relations between supplied voltages and occurring currents of the motor can be described from this by:

$$\vec{U}_1^s = R_1 \vec{I}_1^s + \frac{d\vec{\Psi}_1^s}{dt} \text{ with } \vec{\Psi}_1^s = L_1 \vec{I}_1^s + L_h \vec{I}_2^s \text{ and}$$

$$L_1 = L_{1\sigma} + L_h,$$

$$\vec{U}_2^s = R_2 \vec{I}_2^s + \frac{d\vec{\Psi}_2^s}{dt} - j\Omega_L \vec{\Psi}_2^s \text{ with } \vec{\Psi}_2^s = L_h \vec{I}_1^s + L_2 \vec{I}_2^s \text{ and}$$

$$L_2 = L_{2\sigma} + L_h.$$

The above-cited differential relations were derived under the assumption of a slim magnitude of 1, i.e., standstill. A parameter determination of electrical equivalent circuit magnitudes in the neutral-short circuit and direct current test is based on this T equivalent circuit. As regards a more complicated consideration in an α/β or d/q coordinate system of the motor voltages and motor currents to be presented later, the same equivalent circuit parameters can be taken into account; however, this manner of consideration not only permits a stationary characterization of the motor but also makes possible a description of the dynamic behavior.

The admittance of the motor in the operating behavior can be determined by measuring the electrical magnitudes, which admittance results from the following equation:

a. $G_{\alpha/\beta}(j\omega) = Y_{\alpha/\beta}(j\omega) = \frac{I_{1\alpha/\beta}(j\omega)}{U_{1\alpha/\beta}(j\omega)}.$ Starting from the phase voltages $U_U$, $U_V$ and $U_W$ and phase currents $I_U$, $I_V$ and $I_W$, they are converted in accordance with the above transformation into the α/β coordinate system. Thus, the electrical behavior of the three-phase synchronous machine can be considered with the aid of the input magnitudes $U_1$ or $U_2$ and output magnitudes $I_1$ or $I_2$. In this regard, separate modes of consideration regarding the fixed-stator α axis and β axis can be carried out, so that, for example, as regards the β axis a transmission function or admittance results with:

$G_\beta = I_{1\beta}/U_{1\beta}.$

The determination of the coefficients of the transmission function $G_\beta$ makes possible the identification of the basic system parameters, for example, of electrical equivalent circuit magnitudes. There are, for example, parallel considerations for determining electrical equivalent circuit magnitudes $L_{1\sigma}$, $L'_{2\sigma}$, $L_h$, $R_1$ und $R'_2$ by a similar starting point under the assumption of a rotor standstill (n=0).

The use of a pseudo-noise binary signal (PRBS) as electrical test activation is known from the state of the art for determining mechanical characteristics of a three-phase motor, in particular for diagnosing the errors of mechanical parts or for mechanical system identification during operation in a mechanical connection. The mechanical system constitutes an SISO system here (Single-Input Single-Output) in which a single mechanical output magnitude can be measured by a mechanical shaft encoder with the aid of a single mechanical or electrical input magnitude. The input magnitude is excited with the aid of the pseudo-noise binary signal so that a broadband behavior of the SISO can be determined in the output magnitude. Characteristics of the mechanical system can be derived with the aid of theoretical signal methods of frequency transformation and parameter identification using the frequency behavior given knowledge of the basic system equation.

However, in the case of a determination of magnetomechanical characteristic quantities based on the supply and measuring of purely electrical magnitudes a so-called MIMO system (Multiple-Input Multiple-Output) is involved in which several input magnitudes (phase voltages) must be fed in and several output magnitudes (phase currents) must be extracted. For this reason the methods known from the process for the identification of mechanical magnitudes cannot be used for the electrical system characterization of a three-phase motor. The identification of the mechanical system is comprehensively described in the dissertation of Sebastian Villwock "Identifikationsmethoden für die automatisierte Inbetriebnahme und Zustandsüberwachung elektrischer Antriebe" [German—"Identification Methods for the Automated Starting and Status Monitoring of Electrical Drives", University of Siegen, 2007, (publication [1]). Furthermore, a theoretical signal method for the parameter identification of the mechanical system which method is used in this regard is described in the journal contribution: S. Villwock, J. M. Pacas: "Application of the Welch-Method for the Identification of Two and Three Mass Systems", IEEE Transactions on Industrial Electronics, Vol. 55, No. 1, January 2008, pp. 457-466 (publication [2]). A method which is generically similar was presented in the framework of a conference article in: P. Szczupak, J. M. Pacas: "Automatic Identification of a PMSM Drive Equipped with an Output LC-Filter", IEEE Industrial Electronics, IECON 2006, $32^{nd}$ Annual Conference on November 2006, pp. 1143-1148 (publication [3]).

The present invention has the problem of suggesting a method for determining mechanical characteristic quantities, in particular the mass moment of inertia J of the rotor for an ending three-phase asynchronous motor, whereby a parameter identification without shaft encoder sensors is made possible, the rotor can execute deflection movements here and the mechanical characteristic quantities can be determined by a single measurement. Advantageous further developments of the invention are subject matter of the subclaims.

A further problem of the invention consists in suggesting an apparatus for the identification without shaft encoder in which the identification of the magnetomechanical characteristic quantities can be carried out only by measuring electrical magnitudes, so that no sensors have to be used to determine the mechanical behavior of the asynchronous machine with connected drive line.

DISCLOSURE OF THE INVENTION

In a first aspect of the invention a method is suggested for the identification of mechanical characteristic quantities without shaft encoder, in particular the mass moment of inertia J of the rotor or of the drive line of a three-phase asynchronous motor which method comprises at least the steps:
  constant voltage impression $U_{1\alpha}$ in $\alpha$ axial direction in order to generate a constant magnetic flux;
  test signal voltage supply $U_{1\beta}$ in $\beta$ axial direction of the asynchronous motor (09), whereby the $\alpha$ axial direction remains supplied with constant current;
  measuring signal current measurement $I_{1\beta}$ in $\beta$ stator axial direction of the asynchronous motor (09);
  Identification of mechanical characteristic quantities of the asynchronous motor (09) based on the test signal voltage $U_{1\beta}$ and on the measuring signal current $I_{1\beta}$;
whereby the supplying of a test signal into the asynchronous motor (09) takes place in such a manner that the rotor (11) can execute deflection movements (75) based on the supplying of test signals.

Deflection movements of the rotor mean that the angle $\beta_k$ of the rotor opposite stator can change in any manner during the measuring process. A constant voltage impression into the $\alpha$ axis of the stator brings about a constant current $I_{1\alpha}$. Parallel to this, a test signal is applied into the $\beta$ axial direction of the stator. The structure of the test signal determines which frequency components or frequency areas can be measured and with which accuracy the mechanical characteristic quantities can be identified, whereby parameters can be extracted in accordance with the frequency cover of the test signal. A measuring signal current $I_{1\beta}$ can be measured during the supplying of the test voltage $U_{1\beta}$. The supplying of the two phase voltages for measuring the two phase currents can take place, for example, by means of a ⅔ phase converter that, following the above matrix relation, can generate the three phase voltages $U_U$, $U_V$ and $U_W$ from the two voltages $U_{1\alpha}$ and $U_{1\beta}$ and can transform the two currents $I_{1\alpha}$ and $I_{1\beta}$ from the premeasured currents $I_U$, $I_V$ and $I_W$. A supplying of the test signal $U_{1\beta}$ can take place, for example, by a controlling of an inverter of the motor control device of the three-phase motor. Alternatively, the voltages $U_{1\alpha}$, $U_{1\beta}$ can be supplied directly into the lines of the asynchronous machine. The measuring of the phase current $I_{1\beta}$ can take place via the same current measuring instruments used in a regulation without shaft encoder during the operation of the three-phase motor. In the time range the supplied test voltages and the measured measuring signal currents are recorded as digitally detected scanned values in time, and on their basis the mechanical characteristic quantities can be determined. This preferably takes place by a frequency range analysis, i.e., by a Fourier transformation of the recorded time range data, and by an analysis of the frequency response of the measured transmission function $G_\beta$. Given knowledge of the preciously cited admittance function, that can be represented as a transmission function in the frequency range, the coefficients of the transmission function can be determined by a suitable signal theoretical method, whereby the coefficient-determining parameters can be used for the identification of the mechanical characteristic quantities, in particular motor mass moment of inertia J and of the connected drive line, for example, transmissions and moved machine parts. The mechanical drive line consists of the rotor of the electrical drive machine and of an optionally coupled mechanical load including transmissions, shafts and the like.

In contrast to an asymmetrical test signal supply in accordance with the invention solely into the $\beta$ axis of the stator, an identical supply of the test signal into the α- and the β coordinate direction without constant voltage loading would not generate any torque so that the rotor would remain torque-free and in its position. Thus, no statements could be made about mechanical magnitudes such as inertia moment J.

If a mechanical drive line of the machine is connected to the rotor, the inertia moment of the entire mechanical compound can be determined. A determination of the frequency response of the system, given knowledge of the basic admittance formula G=Y, makes possible the determination of the parameters of the transmission function. Thus, statements about the mechanical characteristic quantities contained in the coefficients of the transmission function can be made by a supplying of a test signal, especially a broad-band test signal, with a single measurement. To this end signal-theoretical methods are used to transform the measured time range data into frequency range data, whereby the frequency response can be detected with formulas, and the coefficients of the basic transmission function and therefore the basic parameters and with them the mechanical characteristic quantities can be identified by a parameter extraction from the frequency response.

Basically, instead of a set test voltage and determination of the measuring current, a set test current with detection of the measuring voltage can also take place. However, in particular powerful motors have a highly inductive behavior so that in order to impress rectangular current switching pulses high driver voltages would have to be applied, as result of which an impressing of tests current is possible only with great expense.

According to an advantageous further development the ratio of constant voltage $U_{1\alpha}$ to test signal voltage $U_{1\beta}$ can be selected in such an optimal manner for achieving a deflection movement at a height such that the mechanical characteristic quantities can be determined with a pre-determinable accuracy. During the supplying of the test signal into the α stator coordinate direction a boundary condition is produced so that a simplified determination of the mechanical characteristic quantities is made possible. However, the magnitude of the constant current supply determines a variation of coefficients of the transmission function and a development of frequency response properties of the β admittance function. Thus, it is important that the amplitudes of the constant voltage and of the test signal are in an appropriate relationship. If the constant voltage in the α axis would be clearly to great or to small, then the parameter identification could only supply inexact values. The method described here is based on the fact that the machine can move out of the flux axis. To this end it can advantageously be conceivable to vary the ratio of constant voltage $U_{1\alpha}$ to the test signal voltage $U_{1\beta}$ and/or to vary the height of the constant voltage $U_{1\alpha}$ and to perform parameter identifications with changed voltage values, whereby the resulting parameters can be determined as average or weighted parameters from the results of the individual parameter identifications. Thus, errors can be reduced in the determination, so that a more precise result can be achieved.

According to an advantageous further development further magnitudes, in particular equivalent circuit characteristic quantities as well as mechanical structural magnitudes such as pole pair number p and/or electrical measuring magnitudes such as $I_{1\alpha}=I_{DC}$ can be taken into account or also identified. Based on the supplied voltages and measured currents in the stationary coordinate system the transmission function can make the following derivation of the model function assuming $U_{1\alpha}$=constant and assuming the supplying of a test signal in $U_{1\beta}$ as well as assuming the knowledge of a developing DC current $I_{1\alpha}$ and of the measuring signal current $I_{1\beta}$ of interest:

The voltage equations in the fixed stator reference system are:

$$\vec{U}_1^s = R_1 \vec{I}_1^s + \frac{d\vec{\Psi}_1^s}{dt} \text{ with } \vec{\Psi}_1^s = L_1 \vec{I}_1^s + L_h \vec{I}_2^s \text{ and}$$

$$L_1 = L_{1\sigma} + L_h,$$

$$\vec{U}_2^s = R_2 \vec{I}_2^s + \frac{d\vec{\Psi}_2^s}{dt} - j\Omega_L \vec{\Psi}_2^s \text{ with } \vec{\Psi}_2^s = L_h \vec{I}_1^s + L_2 \vec{I}_2^s \text{ and}$$

$$L_2 = L_{2\sigma} + L_h.$$

Since the voltage in α direction is $U_{1\alpha}$=constant, a constant DC current $I_{1\alpha}$ in the same direction results when the motor is at a standstill and after the decaying of the transient events. With $I_{1\alpha}$=constant=$I_{DC}$ the flux equations in the representation of components result as:

$$\psi_{1\alpha}=L_1 I_{DC}+L_h I_{2\alpha}, \; \psi_{1\beta}=L_1 I_{1\beta}+L_h I_{2\beta}.$$

It turns out that upon stimulation of the machine of the test signal in the β direction the direct current remains constant in the α direction. The following relation is therefore for the real part of the stator voltage equation:

$$\underbrace{U_{1\alpha}}_{=const} = \underbrace{R_1 I_{1\alpha}}_{const} + L_1 \underbrace{\frac{dI_{DC}}{dt}}_{=0} + L_h \underbrace{\frac{dI_{2\alpha}}{dt}}_{\to =0}$$

Thus, the following results for the real part of the spatial indicator of the interlinkage of the rotor flux:

$$\Psi_{2\alpha} = L_1 I_{DC}$$

$$U_{2\alpha} = 0 = \underbrace{R_2 I_{2\alpha}}_{=0} + L_h \cdot \underbrace{\frac{dI_{DC}}{dt}}_{=0} + L_2 \cdot \underbrace{\frac{dI_{2\alpha}}{dt}}_{=0} + \Omega_L \cdot \Psi_{2\beta}$$

i. →$U_{2\alpha}=\Omega_L \cdot \Omega_{2\beta}=0$ since the short-circuit rotor and therefore
  $\psi_{2\beta}=0$.

The spatial indicator of the interlinkage of the rotor flux accordingly only has a real part. The voltage equations in the β direction are therefore:

$$U_{1\beta} = R_1 I_{1\beta} + L_1 \cdot \frac{dI_{1\beta}}{dt} + L_h \cdot \frac{dI_{2\beta}}{dt}$$

$$U_{2\beta} = R_2 I_{2\beta} + L_h \cdot \frac{dI_{1\beta}}{dt} + L_2 \cdot \frac{dI_{2\beta}}{dt} - \Omega_L \cdot \underbrace{\Psi_{2\alpha}}_{=L_h I_{DC}}.$$

Transition into the image area of the Laplace transformation:

$$U_{1\beta} = I_{1\beta}(R_1 + sL_1) + L_h \cdot s \cdot I_{2\beta} \quad \text{(GI 1)}$$

$$\text{i. } \to I_{2\beta} = \frac{U_{1\beta} - I_{1\beta}(R_1 + sL_1)}{L_h \cdot s}.$$

in which $U_{2\beta}=I_{2\beta}(R_2+s\,L_2)+L_h \cdot s \cdot I_{1\beta}-\Omega_L \cdot L_h \cdot I_{DC}=0$ since the asynchronous motor comprises a short-circuit rotor as rotor, so that the following can be deduced:

$$a. \to 0 = \frac{U_{1\beta}}{L_h \cdot s}(R_2 + sL_2) + \qquad (GI\ 2)$$

$$I_{1\beta}\left(L_h \cdot s - \frac{(R_1 + sL_1)(R_2 + sL_2)}{L_h \cdot s}\right) - \Omega_L \cdot L_h \cdot I_{DC}$$

The following applies for the torque of the machine:

$$M = \frac{3}{2} \cdot p \cdot \mathrm{Im}\{\vec{\Psi}_1^{s*}\ \vec{i}_1^s\} =$$

$$\frac{3}{2} \cdot p \cdot \mathrm{Im}\{(\Psi_{1\alpha} - j\Psi_{1\beta}) \cdot (I_{1\alpha} + jI_{1\beta})\} = \frac{3}{2} \cdot p \cdot (\Psi_{1\alpha}\ I_{1\beta} - \Psi_{1\beta}\ I_{1\alpha}).$$

The following is obtained with $\psi_{1\alpha} = L_h\ I_{DC}$ and $\psi_{1\beta} = L_1 I_{1\beta} + L_h I_{2\beta}$:

$$M = \frac{3}{2} \cdot p \cdot I_{DC} \cdot (L_h I_{1\beta} - L_1 I_{1\beta} - L_h I_{2\beta})$$

With (GI 1) added into the above relation the following is obtained:

$$M = \frac{3}{2} \cdot p \cdot I_{DC} \cdot \left(-\frac{U_{1\beta}}{s} + I_{1\beta} \cdot \frac{R_1 + sL_1}{s} + L_h I_{1\beta} - L_1 I_{1\beta}\right) =$$

$$\frac{3}{2} \cdot p \cdot I_{DC} \cdot \left(-\frac{U_{1\beta}}{s} + I_{1\beta} \cdot \frac{R_1 + sL_h}{s}\right)$$

The relation between mechanical and electrical circuit frequency is:

$$\Omega_L = p \cdot \Omega_m = p \cdot \frac{1}{J}\int M\,dt$$

In the image area the following is obtained with the above relation for the torque:

$$\Omega_L = \frac{p}{J} \cdot \frac{1}{s} \cdot \frac{3}{2} \cdot p \cdot \frac{I_{DC}}{s} \cdot (-U_{1\beta} + I_{1\beta}(R_1 + sL_h)) =$$

$$\frac{3}{2}\frac{p^2 I_{DC}}{Js^2} \cdot (-U_{1\beta} + I_{1\beta}(R_1 + sL_h))$$

since a time integration as division by s results in the Laplace region.

Replacing this relation for $\Omega_L$ in (GI 2) yields:

$$0 = \frac{U_{1\beta}}{L_h \cdot s}(R_2 + sL_2) + I_{1\beta}\left(L_h s - \frac{(R_1 + sL_1)(R_2 + sL_2)}{L_h \cdot s}\right) -$$

$$\frac{3}{2}\frac{p^2 I_{DC}^2}{Js^2}(-U_{1\beta} + I_{1\beta}(R_1 + sL_h)) \cdot L_h.$$

After a few transformations the desired transmission function is obtained:

$$G_\beta = \underline{Y} = \frac{I_{1\beta}}{U_{1\beta}} = \frac{-2 \cdot (R_2 + sL_2) \cdot s \cdot J - I_{DC}^2 \cdot p^2 \cdot L_h^2 \cdot 3}{2 \cdot J \cdot s(L_h^2 \cdot s^2 - R_1 R_2 - s(L_1 R_2 + L_2 R_1) - s^2 \cdot L_1 L_2) -}$$

$$I_{DC}^2 \cdot p^2 \cdot L_h^2 \cdot (R_1 + sL_h) \cdot 3$$

that can be simplified as follows by $$k := \frac{3 \cdot I_{DC}^2 \cdot p^2 \cdot L_h^2}{2 \cdot J}:$$

$$G_\beta = \underline{Y} = \frac{I_{1\beta}}{U_{1\beta}} = \frac{s^2 \cdot L_2 + s \cdot R_2 + k}{-s^3 \cdot (L_h^2 - L_1 L_2) + s^2 \cdot (L_1 R_2 + L_2 R_1) +} \qquad (GI\ 3)$$

$$s \cdot (R_1 R_2 + kL_h) + kR_1$$

This equation can be written parameterized as:

$$G_\beta = \underline{Y} = \frac{I_{1\beta}}{U_{1\beta}} = \frac{s^2 \cdot a_2 + s \cdot a_1 + a_0}{s^3 \cdot b_3 + s^2 \cdot b_2 + s \cdot b_1 + b_0}$$

with $$a_2 = L_2,\ a_1 = R_2,\ a_0 = k,\ b_3 = -(L_h^2 - L_1 L_2),$$

$$b_2 = (L_1 R_2 + L_2 R_1),\ b_1 = (R_1 R_2 + kL_h),\ b_0 = kR_1.$$

In order to determine the coefficients $a_0$, $a_1$, $a_2$, $b_0$, $b_1$, $b_2$ and $b_3$, knowledge about the electrical magnitudes of the equivalent circuit parameters $L_{1\sigma}$, $L'_{2\sigma}$, $L_h$, $R_1$ and $R'_2$ as well as about the pole pair number p and the level of the DC current $I_{1\alpha}$ is required. The pole pair number as a structural magnitude of the motor is known in advance, the level of the DC current can be determined with measuring technology. The magnitude of the equivalent circuit parameters can be determined, for example, from short-circuit tests, direct current tests and neutral tests or by a measuring method for measuring current/voltage based on a comparable inventive idea, which method is subject matter of a parallel patent application. Given knowledge of these magnitudes the parameter k and from it the mass moment of inertia J of the rotor and of the drive line can be identified.

In addition, the characteristic quantities or equivalent circuit parameters that are characterized in the coefficients of the transmission function can also be determined in the framework of the parameter identification. Thus, it is conceivable to identify all parameters, at least in any case the electrical equivalent circuit parameters, flowing into the transmission function from the determined coefficients of the transmission function.

According to an advantageous further development the test signal can be a pseudo-noise binary signal. The test signal should have a high bandwidth in order to make possible the highest possible frequency resolution of the electrical motor behavior. White noise has a uniformly distributed broadband frequency spectrum. A pseudo-noise binary signal (PRBS) is a binary signal that approximates the spectrum of white noise. It can typically assume the values +1 and −1 and is used alternatively to white noise. In particular, the reproducibility of the signal is advantageous, whereby a PRB signal is frequently used in regulating technology for the analysis of an impulse response by means of a maximum length sequence. A PRB test signal can be readily generated by linear feedback shift registers and can be generated, for example, by a DPS (Digital Signal Processor), FPGA (Field Programmable Gate Array) or microcontrollers of a motor regulator for controlling the inverter. Thus, every motor control electronic system can generate such a PRB signal without great modification and feed it in as motor voltage into the motor.

Basically, a frequency range transformation of scanned time range data can take place as desired for the identification of the equivalent circuit parameters in the frequency range. According to an advantageous further development of the invention the identification of the equivalent circuit parameters can comprise a Fourier transformation in accordance with a periodogram method, preferably a Bartlett method, in particular a Welch method. A spectral power density is achieved in the framework of a periodogram method by a Fourier transformation of individual data blocks. The quality of the spectral estimation can be improved in that a number of periodograms that are independent of each other are averaged. This method is known in the literature under the name of the Bartlett method, in which the measured signal is divided into sections. The Welch method represents an expansion of the procedure suggested by Bartlett. Certain window functions can be used here to reduce the leakage effect. The disturbing leakage effect occurs when the signal section is not periodic, a whole multiple of the period or when this signal section is on the edges of zero. The use of a Welch method in the identification of a system of two or of three units is already known from the above-cited publication [2]. The Welch method splits M scanning values into K partial sequences that are weighted with a window function and is applied to a Fourier transformation. The Welch method described in the publication [1] makes possible the transformation of any number of scanning values with the greatest possible accuracy into the frequency range. The time range data is windowed here, the windowed data divided into partial sequences and Fourier-transformed and periodograms are determined from this that can be used to determine the transmission function, in this instance the admittance function, in the frequency range.

However, alternatively to the above, a correlogram method, also known in the literature under the name Blackman-Tukey estimation, can be used. Here, the spectral estimation takes place on the basis of an autocorrelation function (AKF) and a cross correlation function (KKF) that is calculated from the test signal (excitation signal) and from the measured signal (response signal). In this formulation the spectral power density is obtained by Fourier transformation of the previously estimated AKF and KKF. However, the Welch method furnishes more robust results.

Starting from the presentation of a known transmission function present in the frequency range, for example, of the admittance course, the equivalent circuit parameters of the three-phase motor can be extracted. There have already been a few numeric attempts to this end. A Levenberg-Marquardt algorithm can be used with particular advantage in a further development of the invention in order to identify the characteristic quantities by a determination of the transmission function parameters.

Alternatively, for example, a method according to Nelder and Mead can be used whereby, however, the Levenberg-Marquardt algorithm furnishes more robust results, in particular in the case of data records with a lot of noise. It belongs to the group of gradient methods, whereby better parameter vectors corresponding to the coefficients of the transmission function can be calculated by iterative minimizing of an error function. The Levenberg-Marquardt method is considered at the present as the standard method for non-linear optimizations. It is a mixture of gradient methods and inversion of a Hesse matrix and is also designated in the literature as the method with steepest descent. The inversion of the Hesse matrix is also designated as the Gauss-Newton method. A detailed presentation of the use of the Levenberg-Marquardt algorithm is presented in publication [1], whereby starting from a transmission function:

a. $$G = \frac{s^2 \cdot a_2 + s \cdot a_1 + a_0}{s^3 \cdot b_3 + s^2 \cdot b_2 + s \cdot b_1 + b_0}$$

and with a pattern of the frequency response of the system, the unknown coefficients $a_0$, $a_1$, $a_2$, $b_0$, $b_1$, $b_2$ and $b_3$ can be determined. In comparison to the above-cited admittance presentation, these coefficients correspond to the parameters: $a_2=L_2$, $a_1=R_2$, $a_0=k$, $b_3=-(L_h^2-L_1L_2)$, $b_2=(L_1R_2+L_2R_1)$, $b_1=(R_1R_2+k\ L_h)$, $b_0=kR_1$. Therefore, by determining the unknown coefficients $a_0$, $a_1$, $a_2$, $b_0$, $b_1$, $b_2$ and $b_3$ at least the mass moment of inertia J can be identified by $$J = \frac{3 \cdot I_{DC}^2 \cdot p^2 \cdot L_h^2}{2 \cdot k};$$

however, even the further magnitudes, in particular electrical equivalent circuit parameters, can be identified with this.

According to an advantageous further development of the invention the identified mechanical characteristic quantities can be used in an adjustment and/or optimization of inverter control parameters and/or for motor monitoring. In the regulating of modern asynchronous machines motor control apparatuses are used that can control the inverter appropriately given rapid speed changes or when making available dynamically regulatable output energy based on the knowledge of the electrical equivalent circuit parameters, and can set the phase drive voltages in such a manner that the machine can optimally meet the desired work tasks without overshootings. In this connection the concepts control and regulation are used synonymously. The knowledge of the mechanical dynamic magnitudes, in particular mass moment of inertia of the drive line can serve for the parameterization of the current regulator, whose requirement for a high dynamic range is the greatest as the innermost regulator. In particular, demanding regulating methods that go beyond those of conventional PI regulators require a very precise knowledge of the dynamic behavior of the machine, in particular of the mass moment of inertia J. In particular state space regulators, dead-beat regulators or model sequence regulators are to be cited here. Since in particular sensorless motor controls are being used in recent times, the dynamic behavior in a complex machine environment can be determined by the suggested method without shaft encoder and the motor regulator can be adjusted on site. The mass moment of inertia J represents a decisive characteristic quantity of the dynamic drive behavior so that in particular during the regulation of complex transient transition processes of the machine a precise controlling of the inverter becomes possible. A regulator adjustment free of overshootings and an optimized rapid dynamic regulation of the motor becomes possible here. In particular, the use of such an optimized motor regulation is conceivable in the area of printing machines, machines for producing and working plastic surfaces or of roller machines and packaging machines in which dynamic-optimized motor control methods must be used. In particular in the case of four-color printing machines the slightest deviations in the color printing are recognizable in motor control inaccuracies. In the production of extremely smooth and thin plastic surfaces a uniform thickness of the plastic layer can only be achieved with optimal regulation of the dynamic range, whereby no optical impurities of the plastic material can occur. During the analysis of the mechanical characteristic quantities the rotor moves only to a slight extent without the danger of a mechanical overloading, whereby the mass moment of inertia in the installed state of the motor can be electrically identified without noticeable influencing the drive line. A regulator parameterization serves to optimize the control parameters of the inverter, whereby a deviation of the characteristic quantities from, for example, previous measurements can be taken into account for the error monitoring of the motor or for controlling wear. In particular, the use of the method in the framework of a condition monitoring of the motor can be advantageous, so that from time to time the method can re-determine the characteristic quantities, adaptively adapt the rotor regulator and can emit an error signal in the case of noticeable deviations from previously identified or presettable parameter values, so that the motor or control electronics can be checked.

A coordinate aspect of the invention suggests an identification device for the identification of magnetomechanical characteristic quantities without a shaft encoder, in particular mass moment of inertia J of the rotor of a three-phase asynchronous motor suitable for carrying out a method in accordance with one of the previously cited exemplary embodiments. The identification device comprises an inverter interface unit that can be connected to an inverter control device for the controlling communication and for the determination of the rotor standstill position. The identification device is characterized in that it comprises a test signal generation apparatus for generating an $\alpha/\beta$ test signal, a U/V/W transformation unit for transforming the $\alpha/\beta$ test signal into an UN/W control test signal, an $\alpha/\beta$ transformation unit for transforming measured U/V/W measuring signal currents into $\alpha/\beta$ measuring signal currents and comprises a parameter identification unit for identifying the mechanical characteristic quantities.

Thus, this invention relates to an identification apparatus that is designed for performing a previously cited method and opens up the possibility to this end of communicating by an inverter interface unit with an inverter control apparatus, in particular with the semiconductor components of the inverter, in order to switch them or to query their operating state. By setting a $U_\alpha$ direct voltage the inverter can impress a constant current $I_{DC}$ into the $\alpha$ axis of the motor. Parallel to this, a test signal voltage is set in the $\beta$ axis on the basis of which test signal voltage a measuring signal current $I_\beta$ can be measured, as a result of which the rotor can be put in a rocking rotary movement. The identification apparatus comprises a test signal generation apparatus that can generate the DC voltage of the $\alpha$ axis and generate the $\beta$ test signal, whereby the test signal, in particular a PRB noise signal, can be converted by a U/V/W transformation unit into a UN/W control test signal that can be supplied to the inverter control apparatus. In the motor the control test signal generates corresponding test signal voltages in the three motor phases. Furthermore, the identification apparatus comprises an $\alpha/\beta$ transformation unit that can convert the measured $I_U$, $I_v$ and $I_w$ measured signal currents into $\alpha/\beta$ measured signal currents $I_\alpha$ and $I_\beta$ and comprises a parameter identification unit that, starting from the test signal voltages $U_\alpha$, $U_\beta$ present in the time range and from the measured signal currents $I_\alpha$, $I_\beta$ can carry out a parameter identification according to previously cited methods. Such an identification apparatus can be constructed in a multipartite manner, whereby the motor controller of a motor control apparatus can be used to generate the test signal. The measured currents can also be recorded by the motor control apparatus. An external computer can read out these measured and supplied voltages and currents, transform them into the frequency range and carry out a parameter identification.

According to an advantageous further development of the identification apparatus the parameter identification unit can comprise a Fourier transformation means, in particular an FFT/DFT means for the Fourier transformation of discontinuous $\alpha/\beta$ scanning signal values according to the Welch method and comprise a parameter determination means, in particular a Levenberg-Marquardt transmission function-parameter determination means. Accordingly, the parameter identification unit comprises a Fourier transformation means for transferring the supplied and measured voltage- and current time scan values $U_{1\beta}$, $I_{1\beta}$ and comprises a parameter determination means that, starting from the transmission function $G=I_{1\beta}/U_{1\beta}$ present in the frequency range, can carry out a determination of the transmission function coefficients $a_0$, $a_1$, $a_2$, $b_0$, $b_1$, $b_2$ and $b_3$. The computer processes necessary for this can be performed, for example, in a DSP, a microcontroller of an FPGA, in a PC or a small computer, whereby a logical and structural separation between test signal generation, measured value storage, Fourier transformation and parameter determination is possible. The signal processing and the subsequent numeric process can advantageously be provided as software implementation at least partially on a motor regulator or motor control apparatus.

Thus, it is conceivable to build the Fourier transformation means up as FPGA in order to realize a rapid Fourier transformation with the aid of a static switching circuit, and to implement the parameter identification means as variable calculating software on a high-performance DSP of a motor control regulator. A test signal production and measured value storage can be carried out in an inverter motor control device. Fourier transformation and parameter identification can also take place by a motor control device or by an external identification apparatus that comprises an interface to the communication with the motor control device. Thus, the motor control device can be provided with low calculating power, and demanding theoretical signal tasks can be processed in an external identification apparatus that can be connected to the motor control device, as a result of which hardware expense can be saved.

According to an advantageous further development the apparatus can furthermore comprise a monitoring and optimization unit that is set up to determine, optimize and/or monitor control parameters of an inverter control apparatus on the basis of the mechanical characteristic quantities. The monitoring and optimization unit receives the determined characteristic quantities of the parameter identification unit and can optimize control parameters of the motor control device on the basis of the determined mechanical characteristic quantities, in particular as regards a dynamic regulator behavior and/or filter properties in order to reduce the effects of the inductive behavior of the asynchronous motor on the mains. Furthermore, an efficient operation of the motor control can be optimized and motor changes monitored and/or an error signal can be emitted in the case of a motor failure or erroneous behavior. The dynamic machine behavior to be taken into account can be routinely re-identified in the framework of a conditioning monitoring by the monitoring and optimization unit after a certain time interval or, for example, when replacing the motor or motor parts.

In a coordinate aspect the invention suggests a motor control device for the shaft-encoderless control or regulation of a three-phase asynchronous motor that comprises a previously described identification apparatus for the shaft-encoderless identification of mechanical characteristic quantities, whereby the mechanical characteristic quantities can be used for the determination, optimization and monitoring of the motor and/or of the motor control. Thus, this aspect suggests a motor control device that can perform in a customary manner a sensor-based or shaft-encoderless control of the speed behavior of the asynchronous motor and that comprises an identification apparatus or communicates with such an identification apparatus, and that uses the identified characteristic quantities for the optimization of the regulating behavior, for the determination of electrical magnitudes and of the dynamic behavior for the control of the motor and for the monitoring of an error-free behavior of the asynchronous motor and/or of the motor control.

Thus, the determined characteristic quantities can serve for the optimal adjustment of control characteristics so that a dynamic regulatory behavior can become possible without overshootings. Thus, the identified parameters can be used for the optimization of the current consumption and of the energy efficiency of the asynchronous motor and be used, for example, for a filter parameterization for adjusting electronic filters, or they can be used for monitoring the error-free behavior of the motor control device and/or of the asynchronous motor. In the case of a predeterminable deviation of the identified characteristic quantities in contrast to previously determined or given characteristic quantities an instance of an error can be assumed or a new determination of the characteristic quantities carried out. In the case of a repair or the replacement of the motor, the motor control device can adaptively identify the characteristic quantities of the new motor and adjust itself in an optimal fashion to the new motor. Such a self-calibration of the motor control device can take place in the workplace or during the assembly of the machine at the customer's or in the running operation in the framework of a condition monitoring.

An advantageous further development suggests that the motor control device is arranged in such a manner that an automated identification of the mechanical magnitudes can be carried out at least during the first startup, preferably several times in the course of the service life, whereby an error signal can be initiated upon a demonstrable deviation of the identified characteristic quantities from previously determined, stored and/or model-related characteristic quantities. Thus, this aspect suggests that an identification of characteristic quantities is carried out at least upon a first-time startup or upon a test run in the workplace but preferably in the framework of a condition monitoring or during a repair or exchange of parts of the motor, whereby the motor control device can consider these mechanical characteristic quantities for optimization, adjustment and monitoring of the motor. Thus, a "universal" motor control device can be created that can adapt itself in an adaptive manner to an entire series of different asynchronous motors, whereby an identification of the electrical magnitudes can be performed at the motor standstill. Changes in the motor that are conditioned by age can be taken into account by an adaptive correction of the regulator parameters and erroneous functions of the motor or of the monitoring of the motor control can be recognized.

Finally, a coordinate aspect of the invention suggests a usage of the previously cited method for the determination, optimization and monitoring of motor regulating parameters for the control and/or regulation of electrical drives, in particular for the adjusting of regulating parameters of a motor control device. It is suggested in this aspect that the determined mechanical characteristic quantities are used for regulation optimization, parameterization and monitoring. A determination of the mechanical characteristic quantities can be carried out, for example, for a construction series of asynchronous motors once on a pattern motor and corresponding regulating parameters can be optimized and adapted for the motor control devices used for this purpose. This can take place in the workshop. If an identification apparatus is provided or can be externally connected in a motor control device, this apparatus can perform a new identification of the parameters in the assembled state of the motor upon the first startup, during repair measures or in routine or running monitoring of the status (condition monitoring). To this end parts of the method such as the frequency range transformation and the determination of parameters can be carried out on an external computer and other parts such as, for example, the supplying of the test signal and the conversion of the three-phase system into the two coordinate system are carried out in the motor control device. However, it is decisive that the identified mechanical characteristic quantities can be used for the optimal regulator parameterization, filter adjustment and electrical dimensioning of structural parts.

DRAWINGS

Further advantages result from the following description of the drawings. Exemplary embodiments of the present invention are shown in the drawings. The drawings, specification and the claims contain numerous features in combination. The person skilled in the art will consider the features even individually in a purposeful manner and combine them to logical further combinations.

The figures show by way of example:

Figure 3:
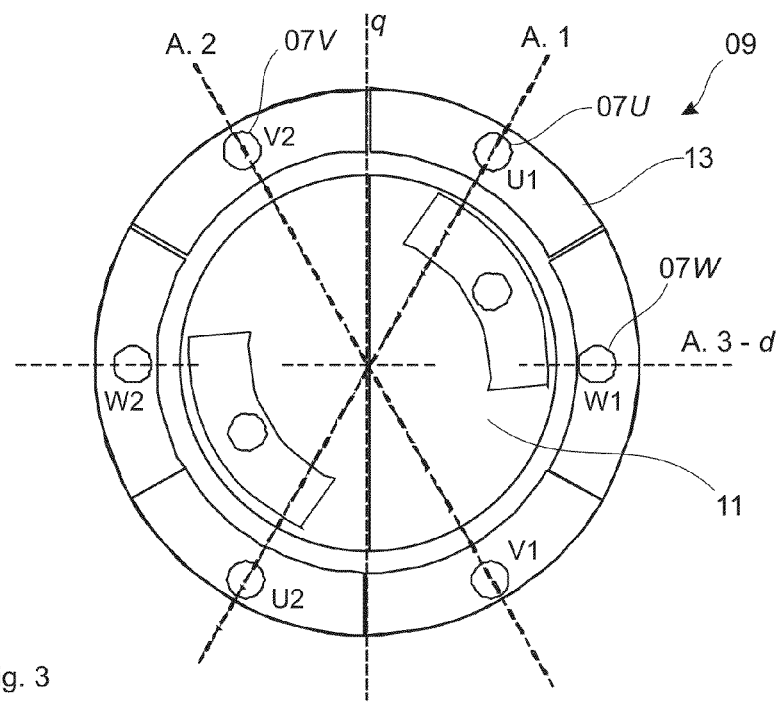
Figure 4:
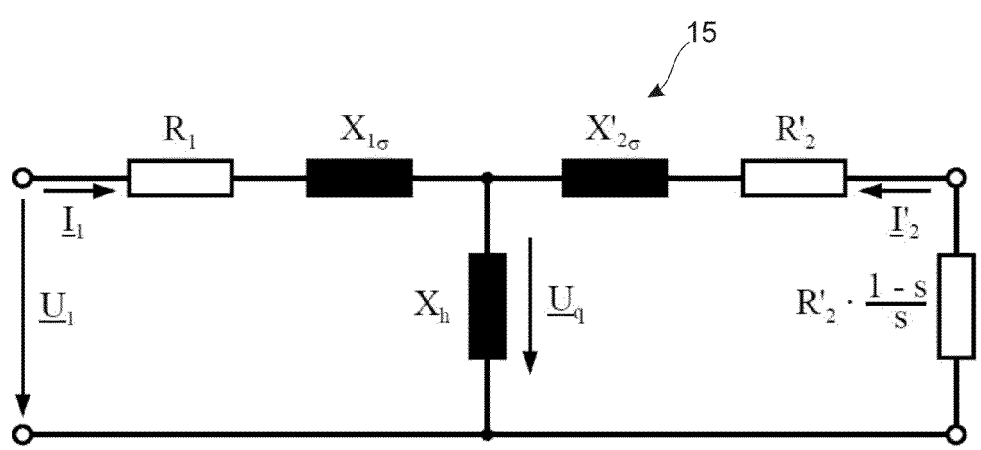
Figure 5:
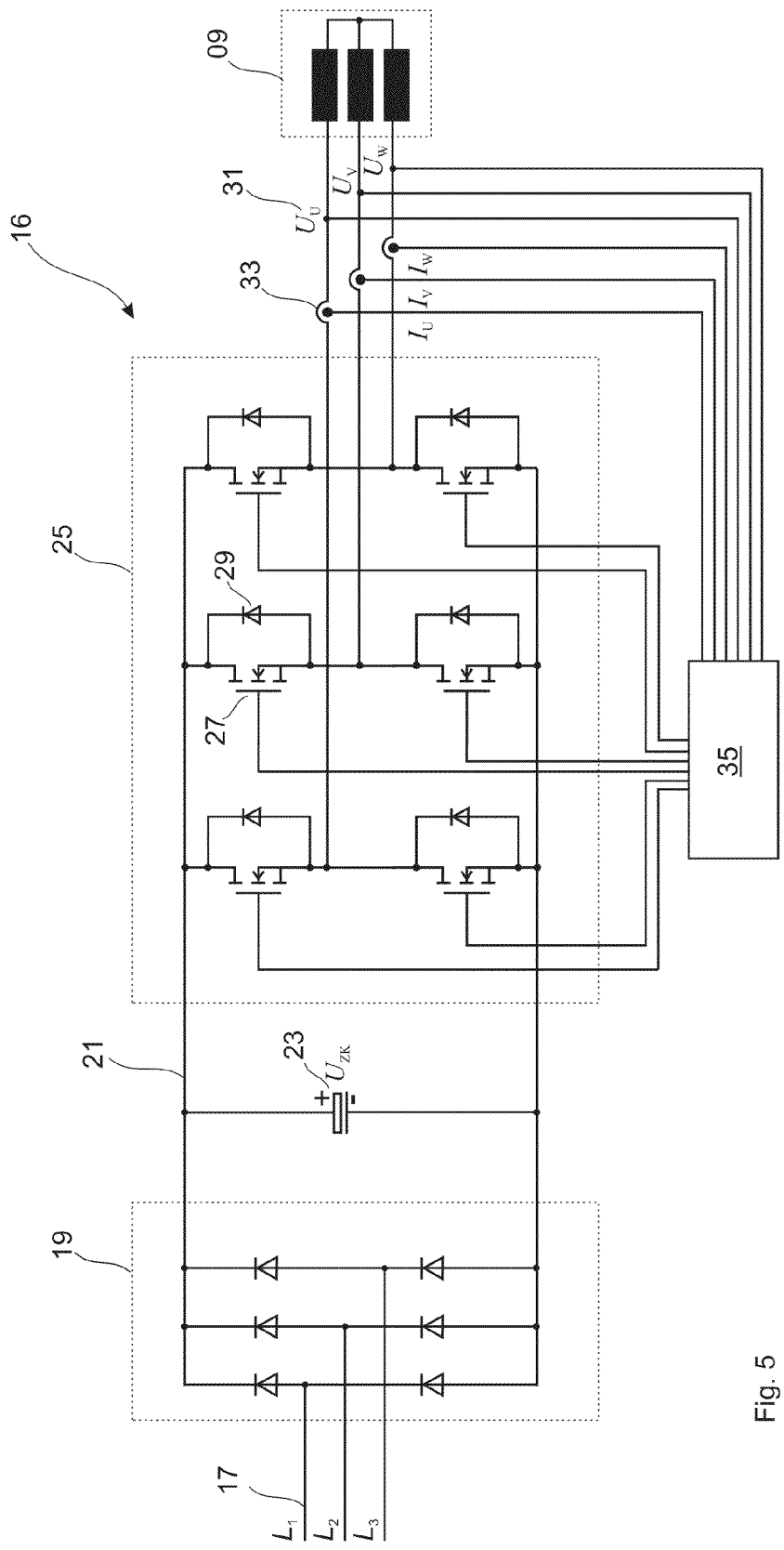
Figure 6:
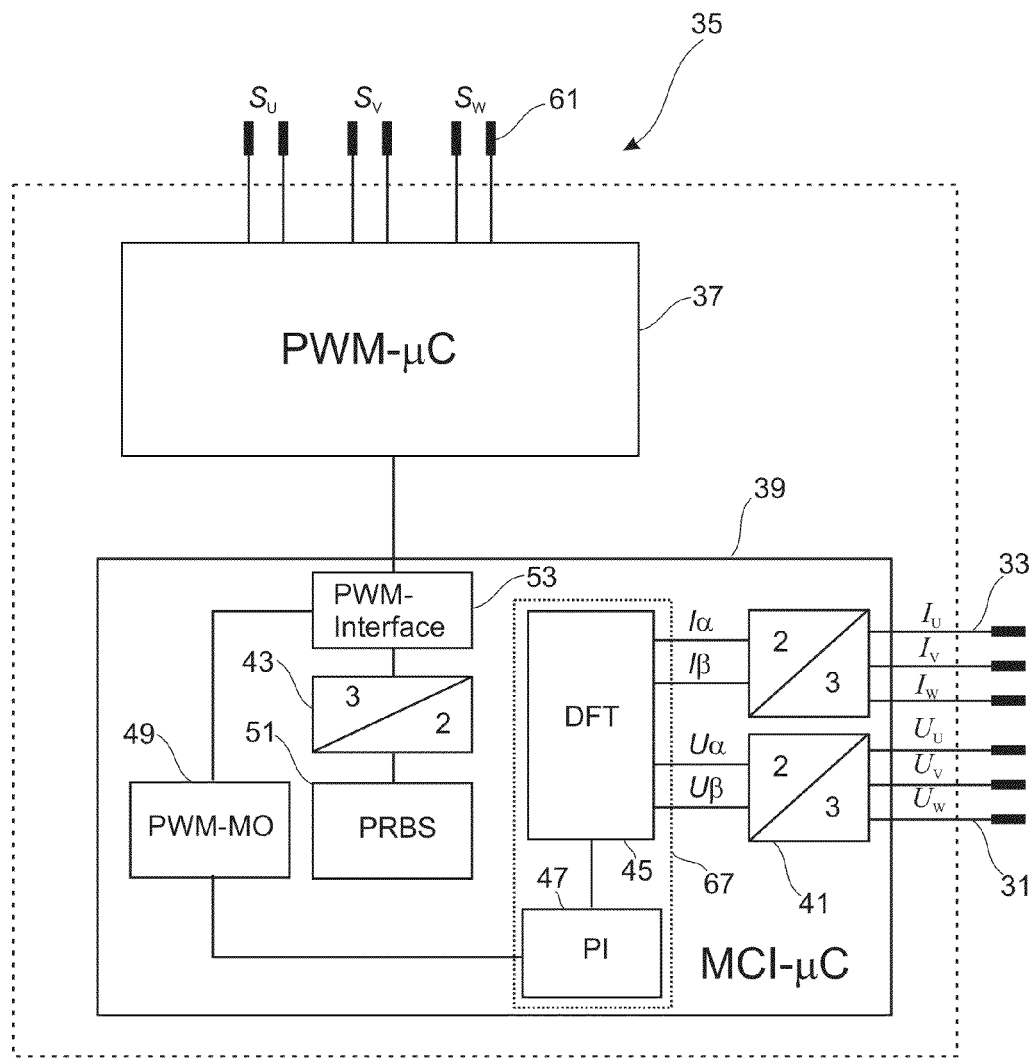
Figure 7:
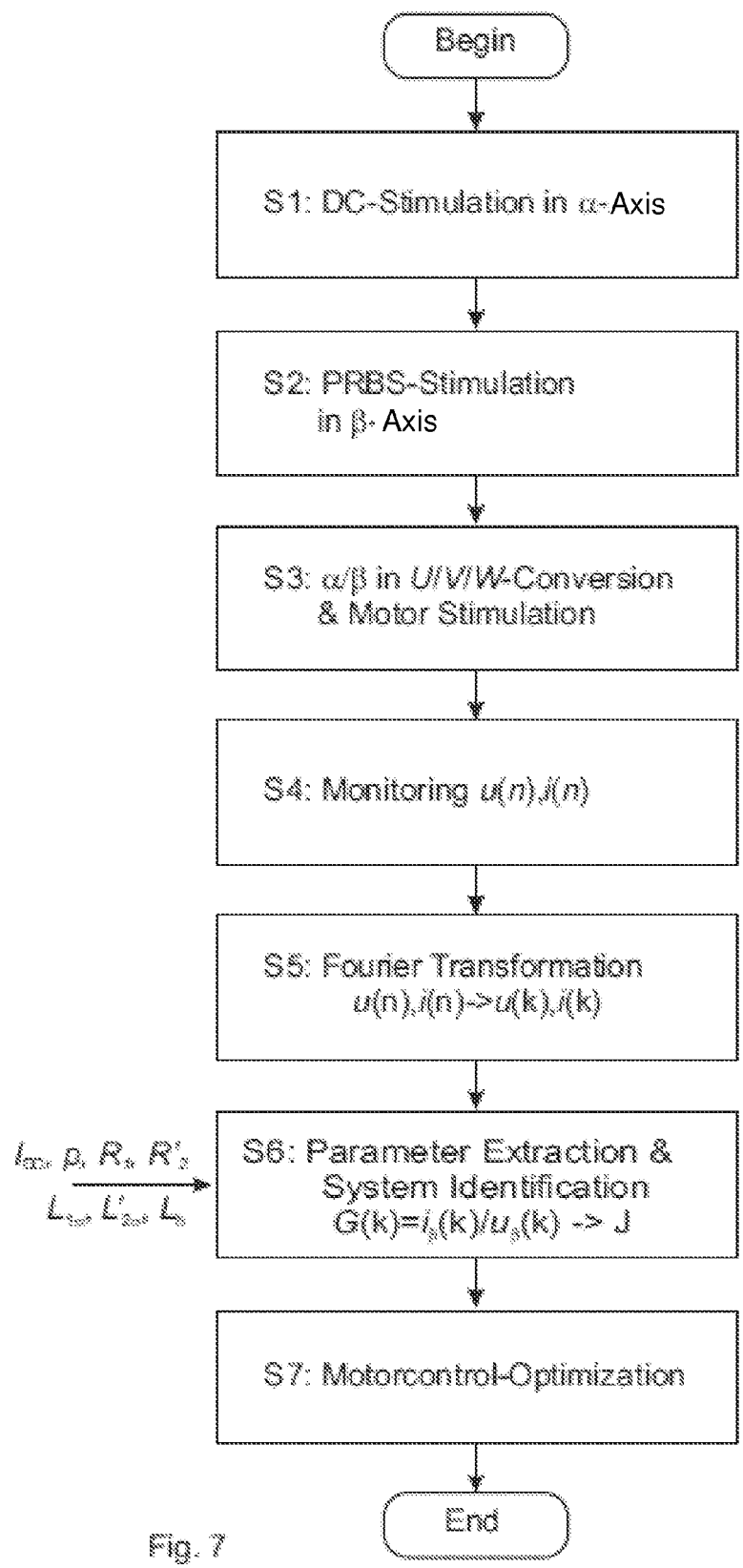
Figure 8:
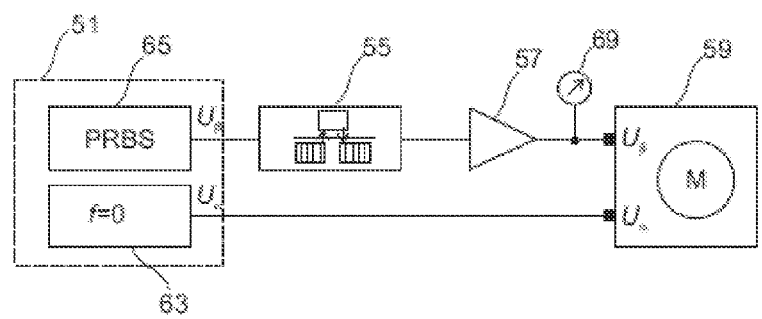
Figure 9:
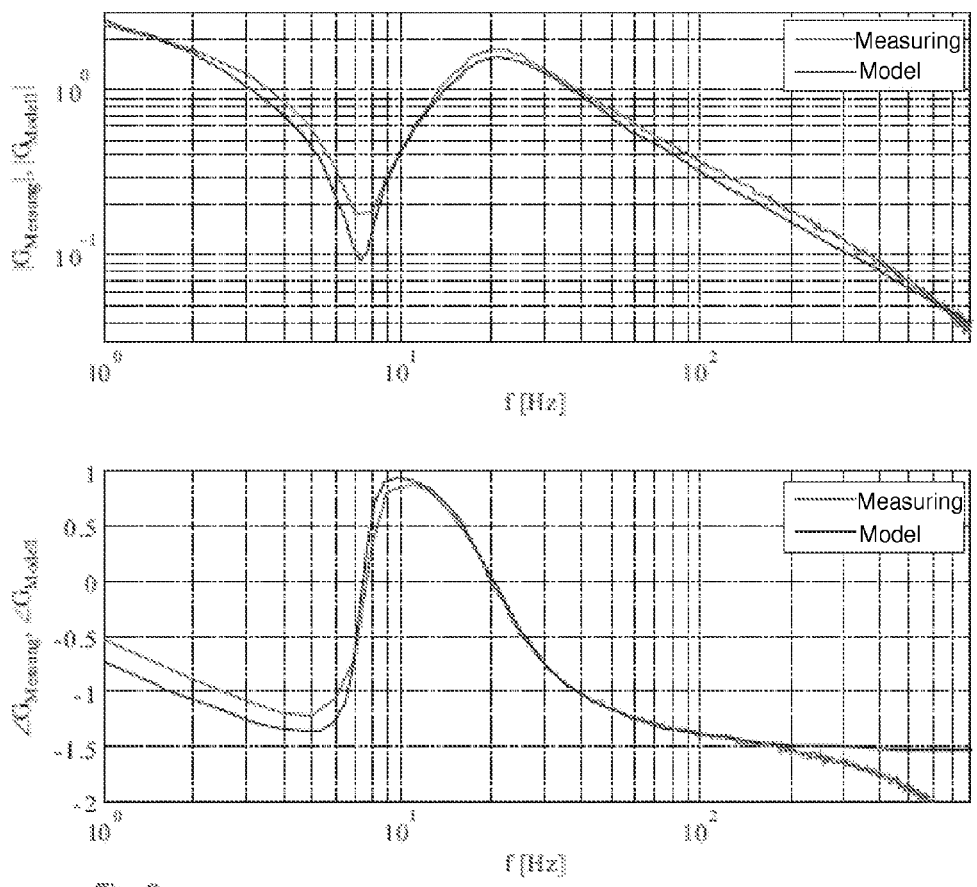

FIG. 3 schematically shows a construction of an asynchronous motor with squirrel-cage rotor;

FIG. 4 shows a T-equivalent circuit of an synchronous motor;

FIG. 5 shows a first exemplary embodiment of a motor control device of the invention;

FIG. 6 shows an exemplary embodiment of a motor control apparatus in accordance with the invention;

FIG. 7 shows an operating sequence of an exemplary embodiment of a method in accordance with the invention;

FIG. 8 schematically shows an exemplary embodiment of a test signal supply into a mathematical model of an asynchronous motor;

FIG. 9 shows an amount phase course of an admittance from measured time range data when using a method in accordance with the invention;

EMBODIMENTS OF THE INVENTION

In the figures the same or similar components are designated with the same reference numbers.

Figure 1:
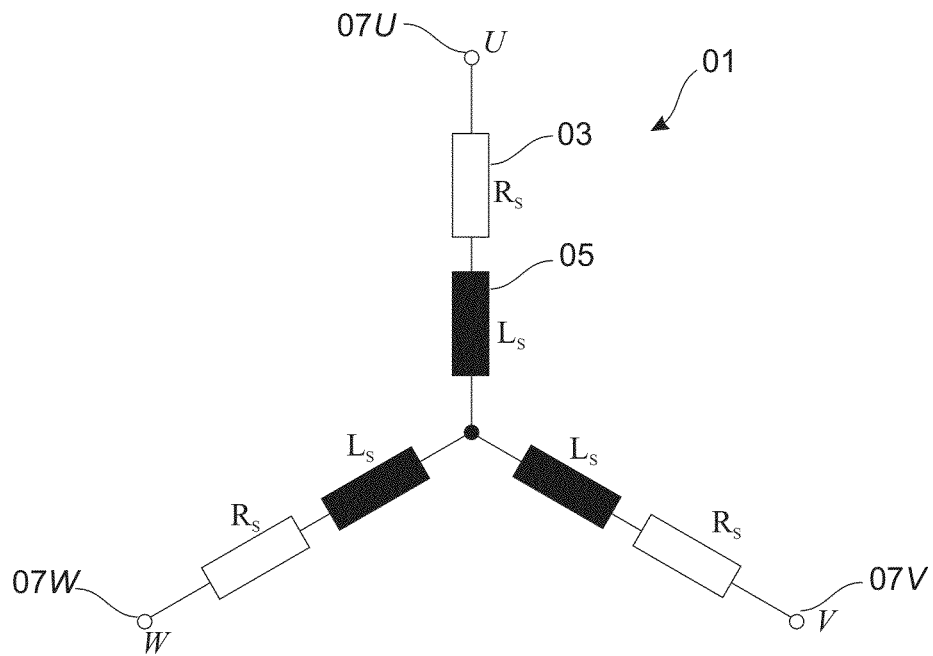
FIG. 1 shows an equivalent circuit of a stator coil of an asynchronous motor in a star connection.

In order to explain the invention FIG. 1 shows an equivalent circuit of the stator coil 01 0 3-phase motor. Each coil strand U, V and W comprises a coil resistor $R_s$ 03 and a coil inductivity $L_s$ 05. The three coil strands 07 are connected to each other at their first end and at their second end to the three phases U, V, W of the output of an inverter. The stator coil 01 integrates with the rotatably mounted rotor coil 11, in which a voltage is induced upon the impressing of a rotating magnetic field of the stator coil 01, which voltage generates an oppositely directed rotor magnetic field which puts the motor in rotation.

The speed of the rotor 11 lags behind the magnetic rotary speed of the stator coil 01, as result of which voltage continues to be induced into the rotor 11. The degree of the lag is designated as slip s. The system of rotor coil 11 and stator coil 01 can be considered, instead of in a three-phase system U/V/W, in a stator two-coordinate system α/β or rotor two-coordinate system d/q, from which the T-equivalent circuit of the motor shown in FIG. 4 can be derived.

Figure 2:
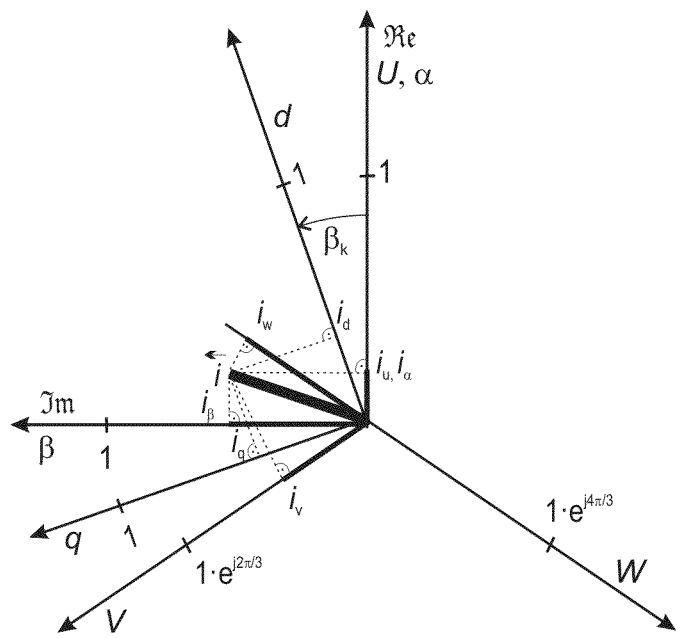
FIG. 2 shows a view of the relation between two-component- and three-phase coordinate systems.

To this end FIG. 2 at first shows the spatial association of the three-phase system U/V/W with three coordinate directions 1 (0°), $e^{j2\pi/3}$ (120°) and $e^{j4\pi/3}$ (240°) compared to the α/β coordinate system of the complex plane with a real part and an imaginary part. Under the assumption of a total current I the latter can be divided relative to the three-phase system into three partial currents $I_U$, $I_V$ and $I_W$. In the same manner the current can be expressed by the partial currents in complex stator-fixed coordinate systems $I_\alpha$ and $I_\beta$. The relationship between $I_\alpha$, $I_\beta$ and $I_U$, $I_V$ and $I_W$ has already been indicated further above. When using the complex representation $I_\alpha$ and $I_\beta$, which indicate the stationary stator axis directions and the three phase currents $I_U$, $I_V$ and $I_W$, the above transformation specifications can be derived. The rotor has a rotating coordinate system d/q that comprises the rotor flux axis d and transverse flux axis q. The association between the rotating coordinates d/q and the stationary coordinates α/β can be established by the rotor angle of rotation $\beta_k$.

FIG. 3a schematically shows the construction of a three-phase asynchronous motor 09. This motor comprises in a simple embodiment a three-phase stator 13 with the coil strands U1, U2 (07-U), V1, V2 (07-V) and W1, W2 (07-W). The stationary stator coils define three coil axes A1, A2 and A3 that correspond to the three phase axes 1, $e^{j2\pi/3}$ and $e^{j4\pi/3}$. Rotor 11 comprises a squirrel-cage rotor in which voltage is induced in a rotating stator magnetic field and whose induced current generates a counter-magnetic field, as a result of which a torque of the motor 09 is produced.

Finally, FIG. 4 shows the equivalent circuit of the interlinkage of stator coil and rotor coil with the phase currents $I_1$, $I_2$ and $U_1$, $U_2$ whereby the index 1 stands for the stator coil and the index 2 for the rotor coil. The equivalent circuit according to FIG. 4 is a T-equivalent circuit and describes the electrical relation between stator coil 01 with $R_1$, $L_{1\sigma}$ 03, 05 and main inductivity $L_h$ to the rotor 11 and the effect of the rotor coil with $R'_2$ and $L'_{2\sigma}$ as well as also with main inductivity $L_h$. The following admittance function can be derived:

$$\text{a. } G_\beta(j\omega) = \frac{I_{1\beta}(j\omega)}{U_{1\beta}(j\omega)},$$

The present invention now has the problem of making possible an identification of the mass moment of inertia J from a frequency response of the values, measured in the time range, of the transmission function with the setting of a constant voltage supplied in the α axis and of a test signal supplied in the β axis. Here, the coefficients of the transmission function $G_\beta$ can be derived by a parameter determination method, given knowledge of the equivalent circuit magnitudes $R_1$, $R'_2$, $L_{1\sigma}$, $L'_{2\sigma}$ and $L_h$, of the pole pair number p and of the DC current strength $I_{DC}$. The coefficient-determining parameters serve for the identification of the mass moment of inertia J. Starting from the knowledge of the mass moment of inertia J, the rotor dynamic can be predicted given supplied voltages $U_\alpha$, $U_\beta$, whereby desired speeds and torques can be optimized by adjusting the regulating parameters.

A description of the transient behavior is essential here, whereby a single analysis of the electrical behavior of the motor makes possible exact knowledge about the mechanical parameters during dynamic events.

FIG. 5 schematically shows a motor control circuit 16 in which the phases of a three-phase supply circuit 17 are converted by a three-phase bridge rectifier 19 into a direct voltage of a DC intermediate circuit 21. A buffer capacitor 23 is provided in the DE intermediate circuit 21 which capacitor smoothes the voltage and, for example, can make buffer energy available for a regulated emergency operation of the motor 09 in case of a power failure. An inverter 25 comprises three switching bridges in which power semiconductor switching elements 27 can switch the motor phases U/V/W opposite the direct voltage +DC and −DC of the intermediate circuit 21 in a coordinated manner and thus make available a PWM-modeled control voltage $U_u$, $U_v$, $U_w$ for the three-phase motor 09 in a speed-variable manner. Each power semiconductor switching element 27, that can comprise an IGBT transistor, a power transistor or the like is protected against overvoltage, in particular inductive reaction by the motor 09, by a free-wheeling diode 29. The phase voltages $U_u$, $U_v$, $U_w$ as well as phase currents $I_u$, $I_v$, $I_w$ are tapped off in the supply lines to three-phase motor 09 and supplied to a motor control device 35. The phase voltages do not have to be necessarily tapped off, since they can be given by the inverter 25, and it is assumed that the theoretical voltage value is equal to the actual voltage value.

The motor control device 35 comprises control lines in order to regulate the individual power semiconductor switching elements 27 in the correct phase depending on the desired speed behavior of the motor 09. In the case of a sensor-based regulation the motor control device 35 is furthermore coupled to position angle sensors and acceleration sensors, whereby temperature sensors can also be connected for monitoring the operating temperature of the motor 09. In the case of a field-oriented regulation without shaft encoder the motor control device 35 can carry out a speed-optimized control of the inverter switching components 27 solely by knowledge of the phase voltages 31 and measured phase currents 33. The regulating parameters of the motor control device 35 can be adjusted by knowledge of the dynamic behavior of the motor 09, that can be described by the equivalent circuit shown in FIG. 4. To this end the motor control device 35 comprises an identification apparatus 39 like the one shown in FIG. 7.

FIG. 6 shows an exemplary embodiment of a motor control device 35 that comprises an identification apparatus 39 for the extraction of mechanical characteristic quantities of the three-phase synchronous motor 09. The motor control device 35 comprises inputs for detecting the three phase currents $I_u$, $I_v$ and $I_w$ as well as detecting the three phase voltages $U_u$, $U_v$ and $U_w$ 31 of the three-phase motor 09, whereby a detection of only two phase voltages and phase currents is sufficient, since the third magnitude results according to Kirchhoff. Furthermore, the motor control device 35 comprises switching outputs 61 for outputting inverter switching signals for actuating the power semiconductor switching elements 27 of the inverter 25. The phase-correct generation of the inverter switching signals 61 takes place by a PWM (Pulse-Width Modulation) microcontroller that represents an inverter control apparatus 37 in order to carry out a regulation of speed and torque of the three-phase motor 09 without sensors or also sensor-supported. The identification apparatus 39 receives the phase voltages 31 and phase currents 33 and comprises an α/β transformation unit 41 that converts the phase voltages and phase currents into the partial voltage $U_\alpha$, $U_\beta$ as well as partial currents $I_\alpha$, $I_\beta$ of the complex two-coordinate system.

The converted phase voltages and phase currents are supplied to a parameter identification unit 67 comprising on the one hand a Fourier transformation means 45 and on the other hand a parameter extraction means 47. A Fourier transformation is applied to the time range data of the phase voltages in phase currents so that this data can be present in the frequency range and the above-defined admittance transmission function $G_\beta$ can be formed. Instead of the admittance function, parameters of another transmission function, in particular impedance function or other logical electrical functional relations can be taken as base and their parameters determined. Starting from the courses of the transmission functions, the parameter identification unit 67 of the parameter extraction means 47, given knowledge of the admittance description function constituting the base, can extract the parameters to be identified from the curve courses. To this end equivalent circuit parameters $R_1$, $R'_2$, $L_{1\sigma}$, $L'_{2\sigma}$ and $L_h$ of the equipment circuit shown in FIG. 4 can flow in that had previously been determined by a related method or by classic measurements of short circuit, direct current and neutral measurements. Given knowledge of the mechanical characteristic quantities, an optimization unit 49, that can perform a modulation of the motor as well as an optimizing of parameter adjustments of the generation of pulse width, can generate control parameters as well as filter parameters for the parameterizing, optimizing and monitoring of the inverter control device 37. The latter are forwarded to a PWM interface 53 and can be transmitted to the inverter control device 37 in order to make possible an optimal regulation of the synchronous motor.

A test signal is supplied in the framework of the parameter extraction into the β stator axis and a direct voltage is supplied into the α axis that can be generated via a test signal generation unit 51. In this exemplary embodiment a pseudo-noise binary signal (PRBS) is generated as test signal that makes the noise signal available as $U_\beta$ by a U/V/W transformation unit 43 and is distributed onto the three phase voltages $U_U$, $U_V$ and $U_W$. This test signal is forwarded to the inverter control device 37, that accordingly controls the inverter 25 in such a manner that the motor 09 is supplied with current in accordance with the test signal.

FIG. 7 shows an exemplary embodiment of a program operating plan for carrying out a method in accordance with the invention. In step S1, at first a direct voltage $U_{1\alpha}$ is supplied into the α axis of the rotor. In step S2 the supplying of a test signal is carried out as a PRB signal into the β axis. A conversion is carried out from the β test signal and the α direct voltage into the phase voltages $U_U$, $U_V$ und $U_W$ and the motor is controlled therewith. The controlled voltage signals U(n) as well as the measured current values I(n) are scanned in the time range and converted by a Fourier transformation, in particular a DFT (Discrete Fourier Transformation) or FFT (Fast Fourier Transformation) using a Welch method into the frequency range, i.e. in this instance into the Laplace range so that the frequency range values U(k), I(k) result. In the Laplace range a transmission function of the admittance can be represented as $$G_\beta(k)=I_\beta(k)/U_\beta(k),$$

that forms the starting basis for the parameter extraction. Given knowledge of the transmission function, the equivalent circuit parameters $R_1$, $R'_2$, $L_{1\sigma}$, $L'_{2\sigma}$ and $L_h$, of the pole pair number p and the magnitude of the DC current of the α axis, a parameter extraction, for example, building on the Levenberg-Marquardt algorithm, can be carried out by a system identification in order to determine the transmission coefficients $a_0$, $a_1$, $a_2$, $b_0$, $b_1$, $b_2$ und $b_3$ from the course of the curve. From this, the value of the parameter k and thus the mass moment of inertia of the drive line J can be derived and used for adjusting motor control parameters, for optimizing load changes or torque changes and/or for adjusting and designing filter parameters for a filtering of motor currents or motor voltages. Given the knowledge of the dynamic magnitudes of the drive line, a parameterization of the inverter control device 37 can be carried out, whereby a high dynamic of the motor behavior can be achieved by optimizing the regulatory behavior of the inverter control device 37 as the innermost regulator. Demanding regulating methods that go far beyond the possibilities of a conventional PI regulator of the asynchronous motor can be achieved here since a precise knowledge of the electrical machine parameters is present. In particular, the regulator parameters for a state space regulator, dead-beat regulator or a model sequence regulation can be exactly adjusted.

FIG. 8 schematically shows the supplying of a test signal of a test signal generation unit 51 into a mathematical model of a three-phase motor 59 as an α/β model in the framework of a Matlab-Simulink simulation. To this end the test signal generation unit 51 comprises an α test signal generation means 63 and a β test signal generation means 65. The β test signal generation means generates a pseudo-noise binary signal that is made available with a typical clock frequency of an inverter control apparatus 37 with 16 kHz and is converted by an apparatus for raising the scan rate 55 to a quasi-time-continuous signal, whereby an amplification of the signal is connected in by a test signal amplifier 57. The course in time of the test signal and of the signal current $I_\beta$ is detected by a signal recording unit 69. The PRB signal is supplied as voltage $U_\beta$ into the mathematical model of the three-phase motor 59. Parallel to this, the α test signal generation means 63 generates a constant voltage that is supplied as $U_\alpha$ into the model of the three-phase motor 59 and that generates a constant current $I\alpha=I_{DC}$.

FIG. 9 shows an amount- and phase course over a frequency range of 0-1 kHz of the admittance function $G_\beta=Y$ that was obtained from a measured machine model and from the exact machine model. It can be clearly recognized that the transmission function $G_\beta$ almost identically coincides with the exact machine model. Thus, a verification of the theoretical model can be demonstrated by numeric simulation. Starting from the scanned phase voltages and phase currents measured in the time range, an almost identical system characterization of the mechanical behavior of the pre-phase motor 09 can be derived.

A closed analytical description of the measured curve was able to be successfully derived with the above mathematical consideration, The measuring of the curves succeeds exclusively from electrical magnitudes but furthermore supplies the sought information about the mass moment of inertia of the asynchronous motor contained according to (GI. 3) in the term for k. The basic idea of the invention is based here on a signal-theoretical consideration of a three-phase electric motor in a two-coordinate space α/β, whereby an evaluation signal that is present as motor current $I_\beta$ can be transformed into the frequency range preferably by means of a Welch method under constant supplying of the α axis with current by means of a one-sided supplying of broad-band test signal, preferably of a PRB signal, as motor voltage $U_\beta$. Building on this, a transmission function $G_\beta$ can be extracted from the supplied and measured signal and the basic system description parameters can be evaluated by a parameter identification method, preferably a Levenberg-Marquart algorithm. Given knowledge of the formula relation of the transmission functions, the individual functional parameters can be identified and therewith the mechanical dynamic behavior of the motor characterized. The invention especially emphasises the special supply type, the structure of the transmission function and the analysis specification, in which the rotor can execute free rotary or oscillating movements in order to determine the mass moment of inertia. The method illustrates the dynamic behavior of the motor over a large operating frequency range or speed range and can be used to adjust, optimize and monitor the motor. In particular when used in a motor control device, a universal motor control device can be made available and can be adaptively used in the workshop or after the assembly of the motor when coupled to a mechanical output line for determining the motor behavior. This makes possible a determination of the parameters describing the machine which is rapid and protects the motor. The method can be retrofitted using software technology into existing motor control devices such as, for example, the Baumüller b_maXX motor controls and servoregulators, in particular the b_maXX 1000-5000 and opens up an automated identification and monitoring of the parameters describing the motor.

LIST OF REFERENCE NUMERALS 01 stator coils equivalent circuit of an asynchronous motor
03 coil resistor
05 coil inductivity
07 U/V/W coil strand
09 asynchronous motor
11 rotor
13 stator
15 equivalent circuit of a stator coil of an asynchronous motor
16 motor control circuit
17 AC supply mains
19 three-phase bridge rectifier
21 DC intermediate circuit
23 buffer capacitor
25 inverter
27 power semiconductor switching element
29 free-wheeling diode
31 phase voltage
33 phase current
35 motor control device
37 inverter control apparatus
39 identification apparatus
41 α/β transformation unit
43 U/V/W transformation unit
45 Fourier transformation means
47 parameter determination means
49 optimization unit
51 test signal generation unit
53 inverter control interface unit
55 scan rate raising unit
57 test signal amplifier
59 α/β asynchronous model
61 inverter switching signals
63 α test signal generation means
65 β test signal generation means
67 parameter identification unit
69 signal recording unit

The invention claimed is:

1. A method for the identification without shaft encoder of mechanical characteristic quantities of a three-phase asynchronous motor (09)
comprising at least the steps:
impressing a constant voltage $U_{1\alpha}$, in α axial direction in order to generate a constant magnetic flux;
supplying a test signal voltage $U_{1\beta}$ in β axial direction of the asynchronous motor (09), whereby the α axial direction remains supplied with constant current;
measuring a measuring signal current $I_{1\beta}$ in β stator axial direction of the asynchronous motor (09);
identifying mechanical characteristic quantities of the asynchronous motor (09) based on the test signal voltage $U_{1\beta}$ and on the measuring signal current $I_{1\beta}$;
whereby the supplying of a test signal into the asynchronous motor (09) takes place in such a manner that the rotor (11) can execute deflection movements based on the supplying of test signals.

2. The method according to claim 1,
characterized in that
the ratio of constant voltage $U_{1\alpha}$ to test signal voltage $U_{1\beta}$ is selected in such an optimal manner for achieving a deflection movement at a height such that the mechanical characteristic quantities (79) can be determined with a pre-determinable accuracy.

3. The method according to claim 2,
characterized in that
for the identification of the mechanical characteristic quantities further magnitudes are taken into account or also identified.

4. The method according to claim 3,
characterized in that
the test signal is a pseudo-noise binary signal.

5. The method according to claim 4,
characterized in that
the identification of the mechanical circuit parameters comprises a Fourier transformation of time-discrete signals according to a Welch method.

6. The method according to claim 5,
characterized in that
the identification of the mechanical characteristic quantities comprises a transmission function determination of parameters.

7. The method according to claim 6,
characterized in that
the identified mechanical characteristic quantities are used in an adjustment or optimization of inverter control parameters or for motor monitoring.

8. The use of the method according to claim 1 for determining, optimizing and monitoring motor regulator parameters for the control of electrical drives.

9. An identification apparatus (39) for the identification without shaft encoder of mechanical characteristic quantities of a three-phase asynchronous motor (09),
the identification apparatus comprising an inverter interface unit (53) that is connected to an inverter control device (37) for controlling communication and for determination of the rotor position,
characterized in that
the identification apparatus (39) furthermore comprises a test signal generation apparatus (51) for generating an α/β test signal, a U/V/W transformation unit (43) for transforming the α/β test signal into an U/V/W control test signal, an α/β transformation unit (41) for transforming measured U/V/W measuring signal currents into α/β measuring signal currents and comprises a parameter identification unit (67) for identifying the mechanical characteristic quantities.

10. The apparatus according to claim 9,
characterized in that
the parameter identification unit (67) comprises a Fourier transformation means (45) for the Fourier transformation of discontinuous α/β scanning signal values according to the Welch method and comprises a parameter determination means (47).

11. The apparatus according to claim 9 and further comprising
a monitoring and optimization unit that is set up to determine, optimize or monitor control parameters of an inverter control apparatus (37) on the basis of the mechanical characteristic quantities.

12. A motor control device (35) for the shaft-encoderless control of a three-phase asynchronous motor (09), comprising:
an identification apparatus (39) for the shaft-encoderless identification of mechanical characteristic quantities of a three-phase asynchronous motor (09),
the identification apparatus comprising an inverter interface unit (53) that is connected to an inverter control device (37) for controlling communication and for determination of the rotor position, the identification apparatus (39) furthermore comprising a test signal generation apparatus (51) for generating an α/β test signal, a U/V/W transformation unit (43) for transforming the α/β test signal into an U/V/W control test signal, an α/β transformation unit (41) for transforming measured U/V/W measuring signal currents into α/β measuring signal currents and a parameter identification unit (67) for identifying the mechanical characteristic quantities, whereby the identified characteristic quantities are used for the determination, optimization and monitoring of the motor control.

13. The device according to claim 12,
characterized in that
the device is arranged in such a manner that an automated identification of the mechanical characteristic quantities is performed at least during the first startup, whereby an error signal is initiated upon a demonstrable deviation of the mechanical characteristic quantities from previously determined, stored or model-related characteristic quantities.

* * * * *